United States Patent
Rinne et al.

(10) Patent No.: US 7,427,557 B2
(45) Date of Patent: Sep. 23, 2008

(54) METHODS OF FORMING BUMPS USING BARRIER LAYERS AS ETCH MASKS

(75) Inventors: Glenn A. Rinne, Apex, NC (US); J. Daniel Mis, Cary, NC (US)

(73) Assignee: Unitive International Limited, Curacao (AN)

( * ) Notice: Subject to any disclaimer, the term of this patent is extended or adjusted under 35 U.S.C. 154(b) by 207 days.

(21) Appl. No.: 11/075,474

(22) Filed: Mar. 9, 2005

(65) Prior Publication Data
US 2005/0215045 A1    Sep. 29, 2005

Related U.S. Application Data

(60) Provisional application No. 60/552,051, filed on Mar. 10, 2004.

(51) Int. Cl.
*H01L 21/44* (2006.01)
(52) U.S. Cl. .............. 438/612; 438/613; 257/E21.508
(58) Field of Classification Search ......... 438/612–614, 438/694, 584, 597; 257/737, 738, E23.021, 257/E23.069, E21.508
See application file for complete search history.

(56) References Cited

U.S. PATENT DOCUMENTS

| | | |
|---|---|---|
| 162,257 A | 11/1875 | Yung |
| 3,986,255 A | 10/1976 | Mandal |
| 4,273,859 A | 6/1981 | Mones et al. |
| 4,733,813 A | 3/1988 | Le Meau et al. |
| 4,752,027 A | 6/1988 | Oschwend |
| 4,763,829 A | 8/1988 | Sherry |
| 4,783,722 A | 11/1988 | Osaki et al. |
| 4,817,850 A | 4/1989 | Wiener-Avenear et al. |
| 4,830,264 A | 5/1989 | Bitaillou et al. |
| 4,840,302 A | 6/1989 | Gardner et al. |
| 4,878,611 A | 11/1989 | LoVasco et al. |
| 4,893,403 A | 1/1990 | Heflinger et al. |
| 4,897,918 A | 2/1990 | Osaka et al. |

(Continued)

FOREIGN PATENT DOCUMENTS

DE    0 782 191 A2    12/1996

(Continued)

OTHER PUBLICATIONS

K. Yung et al; *Electroplated Solder Joints for Flip-Chip Applications*, Transactions on Components, Hybrids, and Manufacturing Technology, vol. 14, No. 3, Sep. 1991, pp. 549-559.

(Continued)

*Primary Examiner*—W. David Coleman
*Assistant Examiner*—Khiem D Nguyen
(74) *Attorney, Agent, or Firm*—Myers Bigel Sibley & Sajovec (57) ABSTRACT

Forming an electronic structure may include forming a seed layer on a substrate, and forming a mask on the seed layer. The mask may include an aperture therein exposing a portion of the seed layer, and a barrier layer may be formed on the exposed portion of the seed layer. A bump may be formed on the barrier layer, and the mask may be removed. In addition, portions of the seed layer may be selectively removed using the barrier layer as an etch mask.

15 Claims, 11 Drawing Sheets

U.S. PATENT DOCUMENTS

| | | | |
|---|---|---|---|
| 4,927,505 A * | 5/1990 | Sharma et al. | 205/123 |
| 4,931,410 A | 6/1990 | Tokanaga et al. | |
| 4,940,181 A | 7/1990 | Juskey, Jr. et al. | |
| 4,950,623 A | 8/1990 | Dishon | |
| 5,024,372 A | 6/1991 | Altman et al. | |
| 5,152,451 A | 10/1992 | Darveaux et al. | |
| 5,154,341 A | 10/1992 | Melton et al. | |
| 5,162,257 A | 11/1992 | Yung | |
| 5,171,711 A * | 12/1992 | Tobimatsu | 438/614 |
| 5,234,149 A | 8/1993 | Katz et al. | |
| 5,293,006 A | 3/1994 | Yung | |
| 5,391,514 A | 2/1995 | Gall et al. | |
| 5,470,787 A | 11/1995 | Greer | |
| 5,634,268 A * | 6/1997 | Dalal et al. | 29/840 |
| 5,886,393 A | 3/1999 | Merrill et al. | |
| 5,892,179 A | 4/1999 | Rinne et al. | |
| 5,902,686 A | 5/1999 | Mis | |
| 5,937,320 A * | 8/1999 | Andricacos et al. | 438/614 |
| 6,133,065 A | 10/2000 | Akram | |
| 6,208,018 B1 | 3/2001 | Ma et al. | |
| 6,221,682 B1 | 4/2001 | Danziger et al. | |
| 6,222,279 B1 | 4/2001 | Mis et al. | |
| 6,335,104 B1 | 1/2002 | Sambucetti et al. | |
| 6,415,974 B2 | 7/2002 | Jao | |
| 6,419,974 B1 | 7/2002 | Silva et al. | |
| 6,622,907 B2 * | 9/2003 | Fanti et al. | 228/215 |
| 6,720,243 B2 * | 4/2004 | Weng | 438/612 |
| 6,762,122 B2 | 7/2004 | Mis et al. | |
| 2001/0011764 A1 | 8/2001 | Elenius et al. | |
| 2001/0020745 A1 | 9/2001 | Jiang et al. | |
| 2002/0086520 A1 | 7/2002 | Chiang | |
| 2002/0096764 A1 | 7/2002 | Huang | |
| 2002/0197842 A1 | 12/2002 | Kuo et al. | |
| 2003/0000738 A1 | 1/2003 | Rumsey et al. | |
| 2003/0107137 A1 | 6/2003 | Stierman et al. | |
| 2003/0143830 A1 | 7/2003 | Akram | |

FOREIGN PATENT DOCUMENTS

| | | |
|---|---|---|
| DE | 197 41 436 | 12/1998 |
| EP | 0 603 296 | 6/1994 |
| EP | 0 782 191 A2 | 2/1997 |
| EP | 0 782 191 | 7/1997 |
| JP | 54-128669 | 10/1979 |
| WO | WO 96/30933 | 10/1996 |

OTHER PUBLICATIONS

E. K. Yung et al; *Flip-Chip Process Utilizing Electroplated Solder Joints,* Proceedings of the Technical Conference, 1990 International Electronics Packaging Conference, Sep. 10-12, 1990, pp. 1065-1079.

T.G. Tessier et al; *Process Considerations in Fabricating Thin Film Multi-chip Modules,* Proceedings of the Technical Conference 1989 International Electronics Packaging Conference, 1989.

PCT International Search Report dated Dec. 9, 1992 of International Appln. No. PCT/US 92/07722 filed Sep. 11, 1992.

Edelstein, D.C., et al; Derwent Publications Ltd. London, GB: AN 2002-308284 XP-002243726, 2002.

International Search Report for PCT/US 02/30697, Jun. 24, 2003.

Jean Audel, et al; *Low Cost Bumping Process for Flip Chip,* Proc. 1995 International Flip Chip, BGA, and Ado Pkg. Symposium ITAP 95, '95 Flip Chip, BGA, TAB & AP Symposium, pp. 16-21 (1995).

M. Data, et al., *Electrochemical Fabrication of Mechanically Robust PbSn C4 Interconnections,* J. Electrochem. Soc., vol. 142, No. 11, pp. 3779-3785 (Nov. 1995).

J.D. Mis, et al: *Flip Chip Production Experience: Some Design, Process, Reliability, and Cost Considerations,* ISHM '96 Proceedings, Proc. 1996 International Symposium on Microelectronics SPIE vol. 2920, pp. 291-295 (1996).

S.K. Kang, et al; *Interfacial Reactions During Soldering With Lead-Tin Eutectic and Lead (Pb)-Free, Tin-Rich Solders,* Journal of Electronic Materials, vol. 25, No. 7, pp. 1113-1120 (1996).

Eric Jung, et al., *The Influence of NiSn Intermetallics on the Performance of Flip Chip Contacts Using a Low Cost Electroless Nickel Bumping Approach,* IEPS Proceedings of the Technical Conference, 1996 Electronics Packaging Conference, Austin, Texas, pp. 14-25 (Sep. 29-Oct. 1, 1996).

\* cited by examiner

METHODS OF FORMING BUMPS USING BARRIER LAYERS AS ETCH MASKS

RELATED APPLICATION

This application claims the benefit of priority from U.S. Provisional Patent Application No. 60/552,051 filed on Mar. 10, 2004, the disclosure of which is hereby incorporated herein by reference in its entirety.

FIELD OF THE INVENTION

The present application relates to the field of electronics, and more particularly, to methods of forming interconnection bumps and related structures.

BACKGROUND OF THE INVENTION

C4 (Controlled-Collapse Chip Connection) is a means of connecting IC (integrated circuit) chips to substrates in electronic packages. Moreover, C4 is a flip-chip technology in which the interconnections are small solder balls on the chip surface. Because it is an area array, C4 technology may provide relatively high densities for chip interconnections.

C4 technology has used since the 1960s and has proven highly reliable in the semiconductor field. Historically, PbSn (lead-tin) solder has been evaporated through a metal mask. In the 1990s, electrochemical fabrication of C4 interconnections was introduced (See, for example, M. Datta, et al., "Electrochemical Fabrication of Mechanically Robust PbSn Interconnections", J. Electrochem. Soc., 142, 3779 (1995); U.S. Pat. No. 5,162,257 to Yung; and WO 96/30933). Electroplating may be more extendible than evaporation to small C4-pad dimensions, and may provide closer pad spacing, larger wafers, and/or lower-melting solders (having a higher content of Sn).

U.S. Pat. No. 5,937,320 discuses barrier layers for electroplated PbSn eutectic solder joints. An electrochemically fabricated C4 interconnection may have a barrier layer between the electroplated tin-rich solder bump and the ball-limiting metallurgy that protects the terminal metal in the ball-limiting metallurgy from attack by the Sn in the solder. The barrier layer may be electroplated through the same photoresist mask as the solder and thus may not require a separate patterning step. A thin layer of electroplated nickel may serve as a reliable barrier layer between a copper-based ball-limiting metallurgy and a tin-lead (PbSn) eutectic C4 ball. U.S. Pat. No. 6,622,907 discusses a sacrificial seed layer process for forming C4 solder balls. The disclosures of U.S. Pat. No. 5,937,320 and U.S. Pat. No. 6,622,907 are hereby incorporated herein in their entirety by reference.

SUMMARY OF THE INVENTION

According to embodiments of the present invention, forming an electronic structure may include forming a seed layer on a substrate, and forming a mask on the seed layer wherein the mask includes an aperture therein exposing a portion of the seed layer. A barrier layer may be formed on the exposed portion of the seed layer, a bump metal may be formed on the barrier layer, and the mask may be removed. In addition, portions of the seed layer may be selectively removed using the barrier layer as an etch mask.

The bump metal may be formed subsequent to selectively removing portions of the seed layer using the barrier layer as an etch mask. More particularly, forming the bump metal may include placing a solid solder preform on the barrier layer. In addition, selectively removing portions of the seed layer may include etching portions of the seed layer exposed by the barrier layer using an etch chemistry that etches the seed layer selectively with respect to the barrier layer.

Forming the bump metal may precede removing the mask and selectively removing portions of the seed layer. More particularly, selectively removing portions of the seed layer may include etching portions of the seed layer exposed by the barrier layer using an etch chemistry that etches the seed layer selectively with respect to the barrier layer and that etches the bump metal selectively with respect to the barrier layer. After selectively removing portions of the seed layer, a surface portion of the barrier layer may be exposed adjacent the bump metal adjacent an edge of the barrier layer. Moreover, forming the bump metal may include plating the bump metal on the barrier layer.

The barrier layer may include a material different than the seed layer and different than the bump material. In addition, the seed layer may include an adhesion layer on the substrate and a conductivity layer on the adhesion layer so that the adhesion layer is between the conductivity layer and the substrate. The adhesion layer may include at least one of titanium, tantalum, tungsten, chromium, aluminum, copper, iridium, platinum, and/or alloys thereof, and/or nitrides thereof. The conductivity layer may include at least one of aluminum, copper, nickel, gold, silver, and/or alloys thereof. The barrier layer may include at least one of nickel, cobalt, platinum, silver, palladium, gold, and/or alloys thereof. For example, the barrier layer may include a layer of nickel-vanadium (Ni:Va). The bump metal may include at least one of antimony, silver, bismuth, tin, lead, copper, silver, gold, nickel, zinc, and/or alloys thereof. In addition, an oxidation barrier may be formed on the barrier layer before forming the bump metal, and the oxidation barrier may include a material different than the barrier layer and different than the bump metal. More particularly, the oxidation barrier may be provided if bump metal is not provided by plating (e.g. placement of a solid solder perform, jetting, printing, etc.). For example, the oxidation barrier may include at least one of copper, tin, platinum, palladium, silver, and/or gold. Moreover, each of the seed layer, the adhesion layer, the conductivity layer, the barrier layer, the oxidation barrier, and/or the bump metal may include a multi-layer structure. According to particular embodiments, the adhesion layer may include a layer of titanium and/or titanium-tungsten; the conductivity layer may include a layer of copper; the barrier layer may include a layer of nickel-vanadium; the oxidation barrier may include a layer of gold; and the bump metal may include solder.

According to additional embodiments of the present invention, an electronic structure may include a substrate, a seed layer on the substrate, and a barrier layer on the seed layer so that the seed layer is between the substrate and the barrier layer. A bump metal may be provided on the barrier layer so that the barrier layer is between the bump metal and the seed layer. In addition, the barrier layer may define a lip extending beyond the bump metal so that surface portions of the barrier layer are exposed adjacent the bump metal along an edge of the barrier layer.

The lip of the barrier layer may extend beyond the seed layer so that the seed layer is set back from the lip of the barrier layer between the barrier layer and the substrate. In addition, the barrier layer may include a material different than the seed layer and different than the bump material. The seed layer may include an adhesion layer on the substrate and a conductivity layer on the adhesion layer so that the adhesion layer is between the conductivity layer and the substrate.

The adhesion layer may include at least one of titanium, tantalum, tungsten, chromium, aluminum, copper, iridium, platinum, and/or alloys thereof, and/or nitrides thereof. The conductivity layer may include at least one of aluminum, copper, nickel, gold, silver, and/or alloys thereof. The barrier layer may include at least one of nickel, cobalt, platinum, silver, palladium, gold, and/or alloys thereof. For example, the barrier layer may include a layer of nickel-vanadium (Ni:Va). The bump metal may include at least one of antimony, silver, bismuth, tin, lead, copper, silver, gold, nickel, zinc, and/or alloys thereof. In addition, an oxidation barrier may be formed on the barrier layer before providing the bump metal, and the oxidation barrier may include a material different than the barrier layer and different than the bump metal. More particularly, the oxidation barrier may be provided if bump metal is not provided by plating (e.g. placement of a solid solder perform, jetting, printing, etc.). For example, the oxidation barrier may include at least one of copper, tin, platinum, palladium, silver, and/or gold. Moreover, each of the seed layer, the adhesion layer, the conductivity layer, the barrier layer, the oxidation barrier, and/or the bump metal may include a multi-layer structure. According to particular embodiments, the adhesion layer may include a layer of titanium and/or titanium-tungsten; the conductivity layer may include a layer of copper; the barrier layer may include a layer of nickel-vanadium; and the bump metal may include solder.

According to still additional embodiments of the present invention, forming an electronic structure may include forming a seed layer on a substrate, and selectively forming a barrier layer on a portion of the seed layer. More particularly, the barrier layer and the seed layer may include different materials, and the barrier layer may include at least one of nickel, cobalt, platinum, silver, palladium, gold, and/or alloys thereof. For example, the barrier layer may include a layer of nickel-vanadium (Ni:Va). Portions of the seed layer may be selectively removed using the barrier layer as an etching mask, and a bump metal may be provided on the barrier layer opposite the seed layer, and the bump metal and the barrier layer may include different materials.

Providing the bump metal, for example, may include placing a solid solder preform on the barrier layer after selectively removing portions of the seed layer. In an alternative, the bump metal may include a bump metal on a second substrate, and providing the bump metal on the barrier layer may include bonding the barrier layer with the bump metal on the second substrate after selectively removing portions of the seed layer. In still another alternative, providing the bump metal may include providing the bump metal on the barrier layer before selectively removing portions of the seed layer. Moreover, selectively removing portions of the seed layer may include etching portions of the seed layer exposed by the barrier layer using an etch chemistry that etches the seed layer selectively with respect to the barrier layer. In addition, the seed layer may include adhesion and conductivity layers.

In addition, an oxidation barrier may be formed on the barrier layer before providing the bump metal, and the oxidation barrier may include a material different than a material of the barrier layer and different that a material of the bump metal. More particularly, the oxidation barrier may be provided if bump metal is not provided by plating (e.g. placement of a solid solder perform, jetting, printing, etc.). For example, the oxidation barrier may include at least one of copper, tin, platinum, palladium, silver, and/or gold. Moreover, each of the seed layer, the adhesion layer, the conductivity layer, the barrier layer, the oxidation layer, and/or the bump metal may include a multi-layer structure. According to particular embodiments, the adhesion layer may include a layer of titanium and/or titanium-tungsten; the conductivity layer may include a layer of copper; the barrier layer may include a layer of nickel-vanadium; the oxidation barrier may include a layer of gold; and the bump metal may include solder.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. Similarly, when an element such as a layer, region or substrate is referred to as being coupled or connected to/with another element, it can be directly coupled or connected to/with the other element or intervening elements may also be present. In contrast, if an element such as a layer, region or substrate is referred to as being directly coupled or connected to/with another element, then no other intervening elements are present. As used herein, the term "and/or" includes any and all combinations of one or more of the associated listed items. The symbol "/" is also used as a shorthand notation for "and/or".

Furthermore, relative terms, such as beneath, upper, lower, top, and/or bottom may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to embodiments of the present invention, a process for forming flip chip bumps having relatively precise definition may be provided. According to particular embodiments, a blanket deposition of a multilayer plating seed layer covers the wafer, and a plating template defines the bump locations. Selective deposition of a barrier layer and the bump metals is performed at the template openings. After removal of the template, the seed layer is removed using the barrier layer as the etch mask. The barrier layer may comprise a material, such as nickel, different than materials of either the seed layer or a solder layer formed on the barrier layer.

Processes described herein may provide for relatively precise definition of a base of the bump by using the barrier layer rather than the solder bump as the etch mask. By using the barrier layer as the mask to remove the seed layer, bump formation processes according to embodiments of the present invention may allow the formation of larger solder bumps without concern for the loss of dimensional control that may result if the bumps were used as the etch mask to define the seed layer etch.

Figure 1:
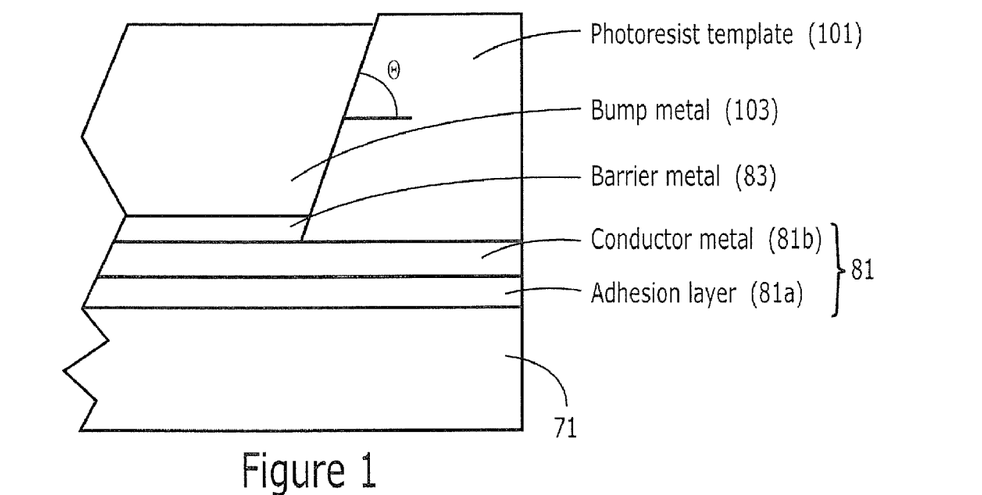
FIGS. 1 and 2 are cross-sectional views of bump formation structures according to embodiments of the present invention.

As shown in FIG. 1, a bonding structure on substrate 71 may include a seed layer 81 (for example, including adhesion layer 81a and conductor layer 81b), a barrier metal 83, and a bump metal 103. By way of example, the adhesion layer 81a may comprise a metal such as chromium, titanium, tungsten, tantalum, aluminum, copper, iridium, platinum, titanium-tungsten, and/or alloys thereof, and/or nitrides thereof. For example, the adhesion layer 81a may include a layer of titanium and/or titanium-tungsten. The conductor metal 81b may comprise a metal such as copper, aluminum, nickel, silver, gold, and/or alloys thereof. For example, the conductor layer 81b may include a layer of copper. The barrier metal 83 may comprise a metal such as nickel, cobalt, platinum, gold, palladium, and/or silver. For example, the barrier metal 83 may include a layer of nickel-vanadium. According to other embodiments, the barrier metal 83 may include a layer of nickel, and the layer of nickel may be doped with boron and/or phosphorous and/or the layer of nickel may be a layer of nickel-vanadium. In addition, an oxidation barrier may be provided between the barrier metal 83 and the bump metal 103, and the oxidation barrier may include at least one of copper, tin, platinum, palladium, silver, and/or gold. For example, the oxidation barrier may include a layer of gold. More particularly, the oxidation barrier may be provided if bump metal is not provided by plating (e.g. placement of a solid solder perform, jetting, printing, etc.) to reduce oxidation of the exposed surface before providing bump metal thereon.

The bump metal 103 may comprise a metal such as tin, silver, bismuth, antimony, lead, copper, gold, nickel, zinc, and/or alloys thereof. According to particular embodiments, the bump metal 103 may include a lead/tin solder. Other layers may also be included in structures (such as to reduce interdiffusion between the adhesion layer and the conductor metal) according to embodiments of the present invention. More particularly, a layer of a metal such as titanium, tantalum, tungsten, chromium, nickel, iridium, platinum, and/or alloys thereof may be included between the conductor metal 81b and the adhesion layer 81a. For example, a phased layer of chromium and copper may be included between the conductor metal 81b and the adhesion layer 81a.

As further shown in FIG. 1, a sidewall of the mask 101 used to form the barrier metal 83 and the bump metal 103 (such as by electroplating) may be sloped at an angle, $\theta$, due to factors such as various process conditions, a Gaussian intensity profile of the light projected through the mask, and/or absorption of light by photoresist (used to form the mask) during patterning which may reduce the intensity with increasing depth. Regardless the cause, a plated bump metal 103 may have a sloped sidewall as a result. Using the bump metal 103 as an etch mask to etch the seed layer 81 may thus involve some uncertainty as to which diameter of the bump metal 103 will define the diameter of the remaining seed layer or UBM. The mask 101, for example, may include one or more of a photo-imageable polymeric material, a metallic material including apertures therein, and/or a flexible polymeric material including apertures therein.

Figure 2:
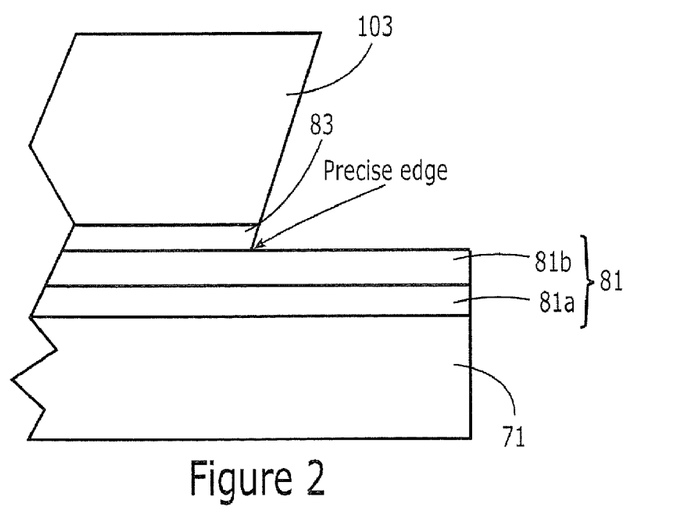

As shown in FIG. 2, the mask 101 may be removed so that sidewalls of the bump metal 103 and the barrier metal 83 and portions of the seed layer 81 are exposed. Accordingly, exposed portions of the seed layer 81 may be removed using the barrier metal 83 as an etch mask. Accordingly, the barrier metal 83 may be different than the conductor metal 81b and different than a metal of the adhesion layer 81a.

Using the barrier metal 83 as the etch mask may require an etchant(s) with relatively high reactivity with the conductor metal 81b and the adhesion layer 81a but with relatively low reactivity with the barrier metal 83. With this approach, the edge definition may be improved.

Figure 3A:
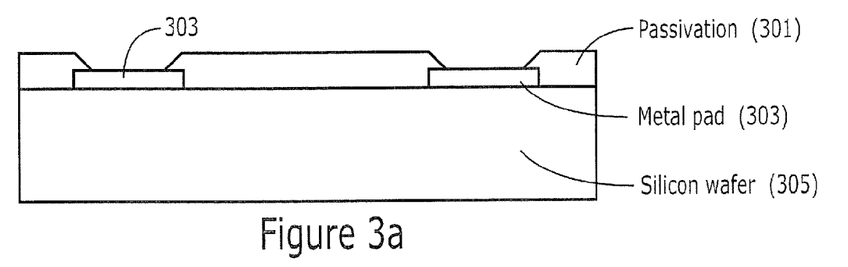
FIGS. 3a-f are cross-sectional views illustrating steps of forming electronic structures according to more embodiments of the present invention.

FIGS. 3a-f are cross-sectional views illustrating steps of forming metallurgy structures according to embodiments of the present invention. As shown in FIG. 3a, metal pads 303 (such as aluminum pads) and a passivation layer 301 (such as a silicon oxide layer, a silicon nitride layer, a polyimide layer, and/or other insulating layers) may be provided on a substrate 305 (such as a semiconductor wafer including electronic devices therein). As shown, via holes in the passivation layer 301 may expose portions of the metal pads 303.

Figure 3B:
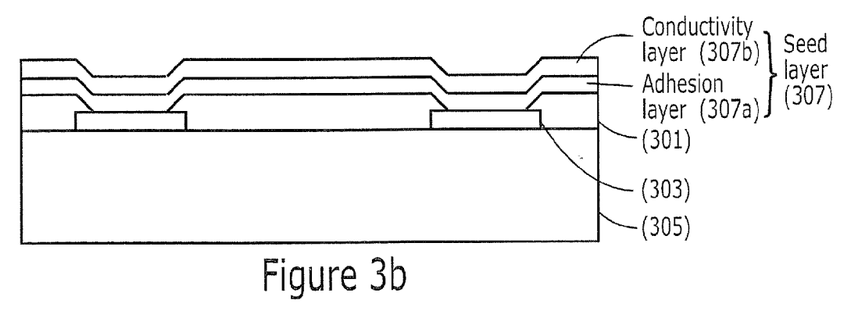

As shown in FIG. 3b, a seed layer 307 may be formed on the passivation layer 301 and on exposed portions of the metal pads 303. By way of example, the seed layer 307 may include an adhesion layer 307a and a conductivity layer 307b. The adhesion layer may include a layer of a metal such as titanium, tantalum, tungsten, chromium, aluminum, copper, iridium, platinum, and/or alloys thereof and/or nitrides thereof. According to particular embodiments, the adhesion layer 307a may include a layer of titanium and/or titanium-tungsten. The conductivity layer 307b may include a layer of a metal such as aluminum, copper, nickel, gold, silver, and/or alloys thereof. According to particular embodiments, the conductivity layer 307b may include a layer of copper. The seed layer 307 may also include one or more additional layers, such as a layer to reduce interdiffusion between the adhesion layer 307a and the conductivity layer 307b. An interdiffusion layer, for example, may include a layer of a metal such as titanium, tantalum, tungsten, chromium, nickel, iridium, platinum, and/or alloys thereof and/or nitrides thereof. According to particular embodiments, an interdiffusion layer may include a phased layer of chromium and copper between the adhesion layer 307a and the conductivity layer 307b.

Figure 3C:
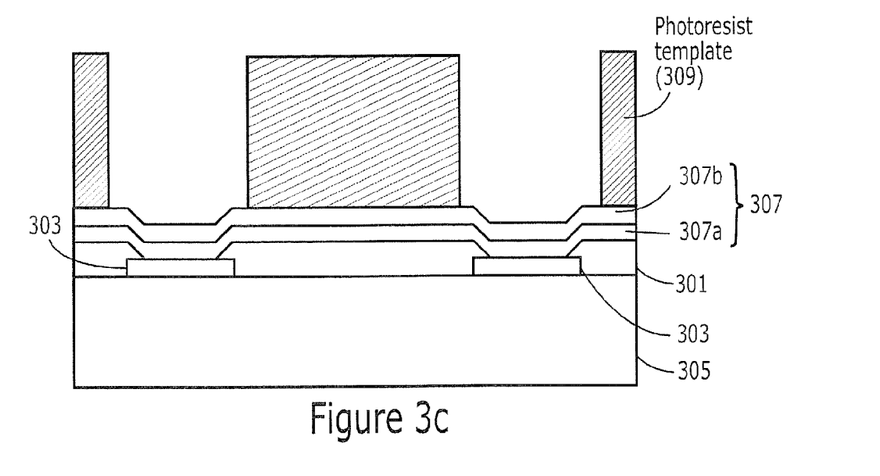

As shown in FIG. 3c, a mask 309 may be formed on the seed layer 307 thereby exposing portions of the seed layer 307 where bump metal is to be formed. The mask 309, for example, may be a photoimageable polymeric material, a metallic material having apertures therein, and/or a flexible polymeric material having apertures therein. According to particular embodiments, the seed layer 307 may be used as an electroplating electrode to electroplate bump metal on portions thereof exposed by the mask 309.

Figure 3D:
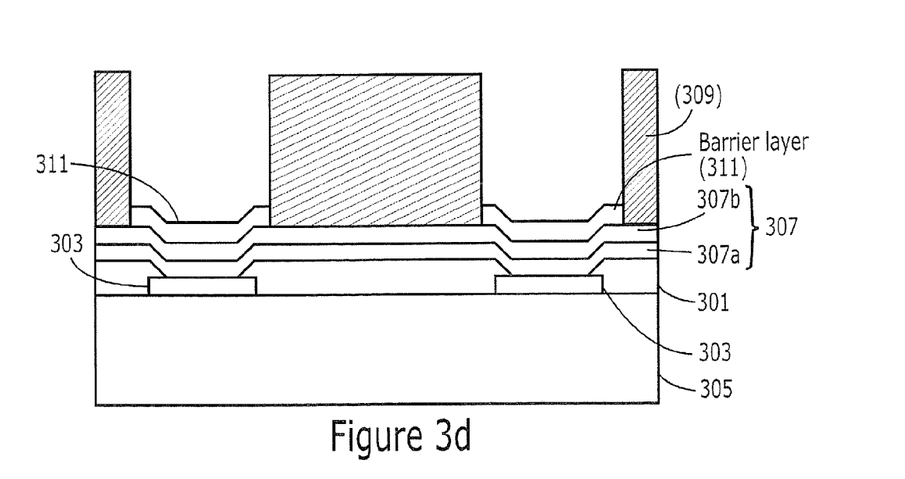

As shown in FIG. 3d, a barrier metal 311 may be formed on portions of the seed layer 307 exposed by the mask 309. Moreover, the barrier metal 311 may be a material different than a material(s) used for the seed layer 307 and different than a material(s) used for the subsequently formed bump metal. The barrier metal, for example, may include a metal such as nickel, cobalt, platinum, silver, palladium, gold, and/or alloys thereof. According to particular embodiments of the present invention, the barrier metal 311 may include a nickel layer, and the nickel layer may be doped with boron and/or phosphorus, and/or the nickel layer may be a nickel-vanadium layer. Moreover, the barrier metal 311 may be formed by electroplating, catalytic plating, and/or electrolytic plating.

Figure 3E:
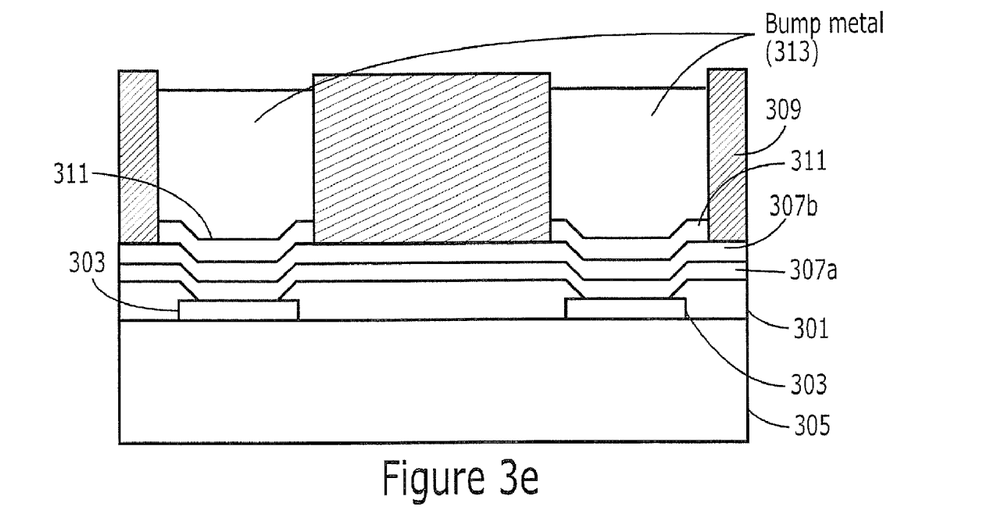

As shown in FIG. 3e, a bump metal 313 may be formed on the barrier metal 311. The bump metal 313, for example, may include a metal such as antimony, silver, bismuth, tin, lead, copper, gold, nickel, zinc, and/or alloys thereof. According to particular embodiments of the present invention, the bump metal may include a lead/tin solder. Moreover, the bump metal may be formed by electroplating, electrolytic plating, and/or catalytic plating. In another alternative, the bump metal 313 may be formed by filling the mask aperture(s) with a solder paste and melting (and cooling) the solder paste to fuse the paste into a solid bump. According to other alternatives, the bump metal 313 may be formed by liquid metal jetting or screen printing. If the bump metal 313 is provided by techniques other than plating, for example, an oxidation barrier may be formed on the barrier metal 311 before providing the bump metal 313, and the oxidation barrier may include at least one of copper, tin, platinum, palladium, silver, and/or gold. The oxidation barrier may be formed, for example, by plating through the mask 309. Oxidation of an exposed surface can thus be reduced before providing the bump metal 313.

Figure 3F:
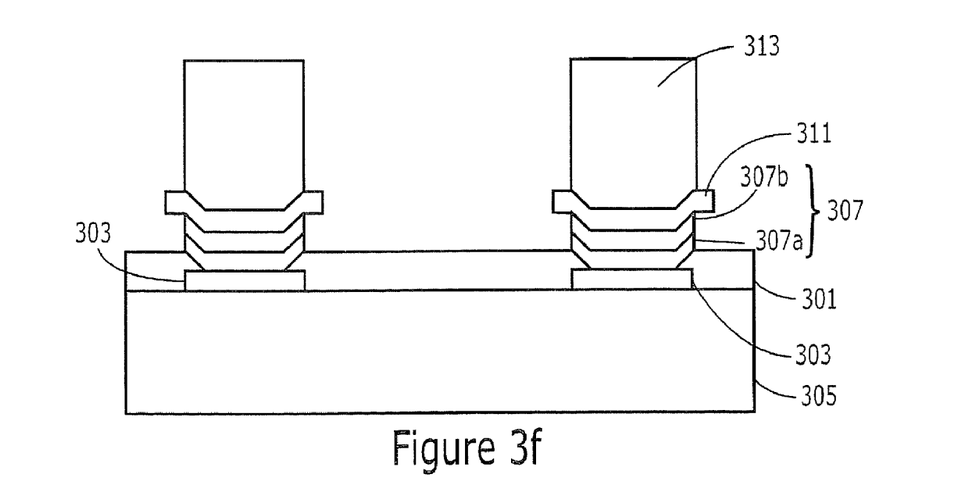

The mask 309 may be removed thereby exposing portions of the seed layer 307, and exposed portions of the seed layer 307 may be removed using the barrier layer 311 as an etching mask, as shown in FIG. 3f. In particular, a wet etch chemistry may be selected that etches the seed layer 307 selectively with respect to the barrier layer 311. Accordingly, undercutting of the seed layer 307 may occur between the barrier layer 311 and the passivation layer 301. Moreover, the wet etch chemistry may be such that the bump metal is also etched selectively with respect to the barrier layer 311. Accordingly, surface portions of the barrier layer 311 may be exposed by the bump metal 313 adjacent edges thereof. More particularly, the bump metal 313 may be sufficiently thicker than the seed layer 307 so that exposed portions of the seed layer 307 may be removed without removing enough of the bump metal 313 to significantly effect performance thereof. The bump metal 313 can then be reshaped by melting (i.e. reflow).

In an alternative, the mask 309 may be removed without forming the bump metal. Solder can then be applied to one or more of the barrier layers 311 by placement of a solid solder preform(s). The solid solder preform(s) can be bonded to the respective barrier layer(s) 311, for example, by pressure, heating, and/or melting. Moreover, exposed portions of the seed layer 307 may be removed using the barrier layers 311 as an etching mask before solder is provided on the barrier layers 311. Solder can then be applied to the barrier layers 311 after removing the exposed portions of the seed layer 307. As discussed above, an oxidation barrier may be formed on the barrier metal 311 before providing the bump metal 313, if the bump metal 313 is provided as solid solder preforms. The oxidation barrier, for example, may include at least one of copper, tin, platinum, palladium, silver, and/or gold. Oxidation of an exposed surface can thus be reduced before providing the bump metal 313. The oxidation barrier, for example, may be plated through the mask 309.

While not shown in FIGS. 3a-f for the sake of clarity, sidewalls of the mask 309, the barrier layer 311, and the bump metal 313 may be sloped at an angle θ as discussed above with respect to FIGS. 1 and 2. Moreover, the bump metal 313 can be used to provide electrical and/or mechanical interconnection with a next level of packaging such as another substrate and/or a printed circuit board. According to particular embodiments of the present invention, the adhesion layer 307a may include a layer of titanium and/or titanium-tungsten; the conductivity layer 307b may include a layer of copper; the barrier metal 311 may include a layer of nickel-vanadium; an oxidation barrier on the barrier metal 311 may include a layer of gold; and the bump metal 313 may include lead-tin solder. Moreover, one or more of the above referenced layers may have a multi-layer structure.

Figure 4A:
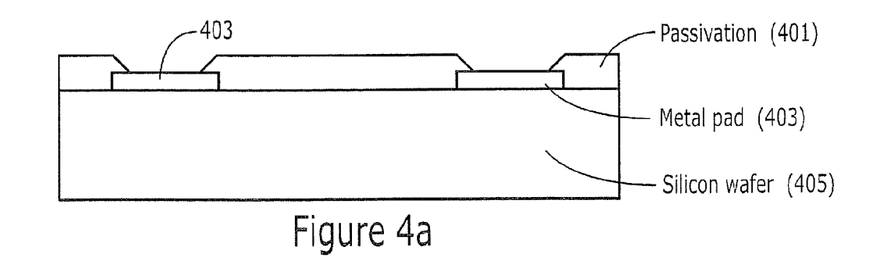
FIGS. 4a-f are cross-sectional views illustrating steps of forming electronic structures according to still more embodiments of the present invention.

FIGS. 4a-f are cross-sectional views illustrating steps of forming metallurgy structures according to additional embodiments of the present invention. As shown in FIG. 4a, metal pads 403 (such as aluminum pads) and a passivation layer 401 (such as a silicon oxide layer, a silicon nitride layer, a polyimide layer, and/or other insulating layers) may be provided on a substrate 405 (such as a semiconductor wafer including electronic devices therein). As shown, via holes in the passivation layer 401 may expose portions of the metal pads 403.

Figure 4B:
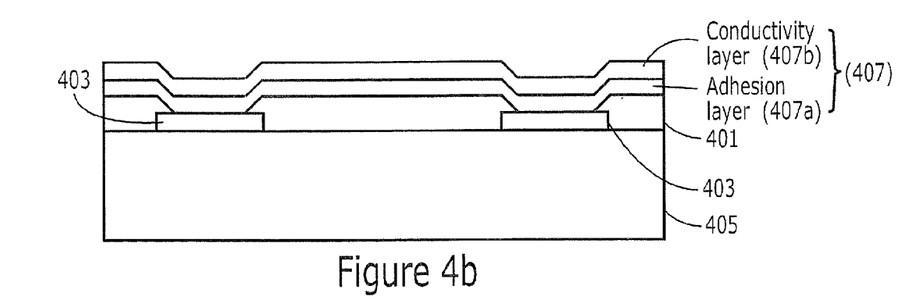

As shown in FIG. 4b, a seed layer 407 may be formed on the passivation layer 401 and on exposed portions of the metal pads 403. By way of example, the seed layer 407 may include an adhesion layer 407a and a conductivity layer 407b. The adhesion layer 407a may include a layer of a metal such as titanium, tantalum, tungsten, chromium, aluminum, copper, iridium, platinum, and/or alloys thereof and/or nitrides thereof. According to particular embodiments, the adhesion layer 407a may include a layer of titanium and/or titanium-tungsten. The conductivity layer 407b may include a layer of a metal such as aluminum, copper, nickel, gold, silver, and/or alloys thereof. According to particular embodiments, the conductivity layer 407b may include a layer of copper. The seed layer 407 may also include one or more additional layers, such as a layer to reduce interdiffusion between the adhesion layer 407a and the conductivity layer 407b. An interdiffusion layer, for example, may include a layer of a metal such as titanium, tantalum, tungsten, chromium, nickel, iridium, platinum, and/or alloys thereof and/or nitrides thereof. According to particular embodiments, an interdiffusion layer may include a phased layer of chromium and copper between the adhesion layer 407a and the conductivity layer 407b.

Figure 4C:
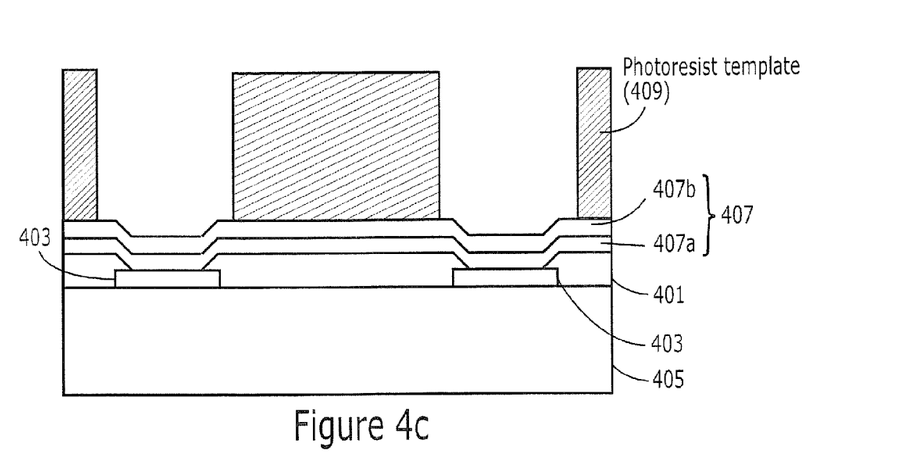

As shown in FIG. 4c, a mask 409 may be formed on the seed layer 407 thereby exposing portions of the seed layer 407 where bump metal is to be formed. The mask 409, for example, may be a photoimageable polymeric material, a metallic material having apertures therein, and/or a flexible polymeric material having apertures therein. According to particular embodiments, the seed layer 407 may be used as an electroplating electrode to electroplate bump metal on portions thereof exposed by the mask 409.

Figure 4D:
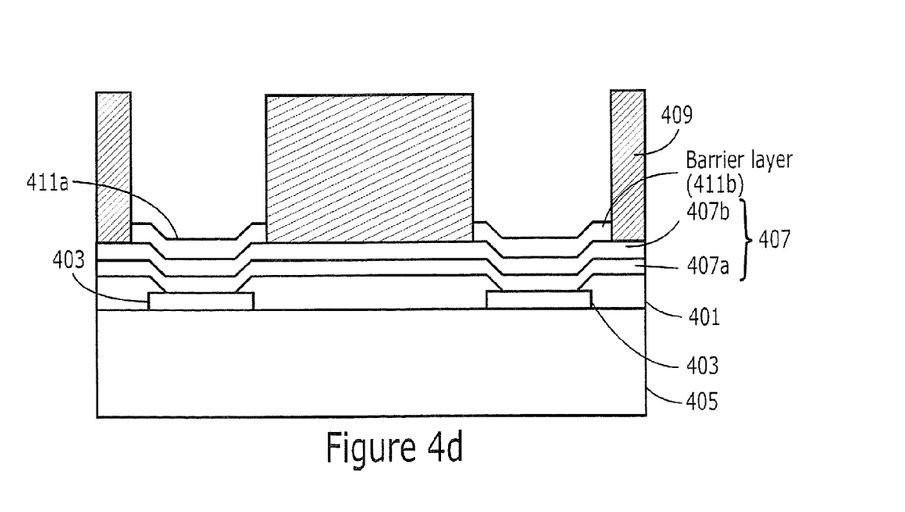

As shown in FIG. 4d, a barrier metal 411 may be formed on portions of the seed layer 407 exposed by the mask 409. Moreover, the barrier metal 411 may be a material different than material(s) used for the seed layer 407 and different than material(s) used for the subsequently formed bump metal. The barrier metal 411, for example, may include a metal such as nickel, cobalt, platinum, silver, palladium, gold, and/or alloys thereof. According to particular embodiments of the present invention, the barrier metal 411 may include a nickel layer, and the nickel layer may be doped with boron and/or phosphorus, and/or the nickel layer may include a layer of nickel-vanadium. Moreover, the barrier layer may be formed by electroplating, catalytic plating, and/or electrolytic plating. In addition, an oxidation barrier may be provided on the barrier metal 411 before providing bump metal thereon, and the oxidation barrier may include at least one of copper, tin, platinum, palladium, silver, and/or gold. The oxidation barrier may be formed by plating through the mask 409. More particularly, the oxidation barrier may include a layer of gold. An oxidation barrier may be provided, for example, if bump metal is provided by techniques other than plating (e.g. placement of solid solder performs, jetting, printing, etc.).

Figure 4E:
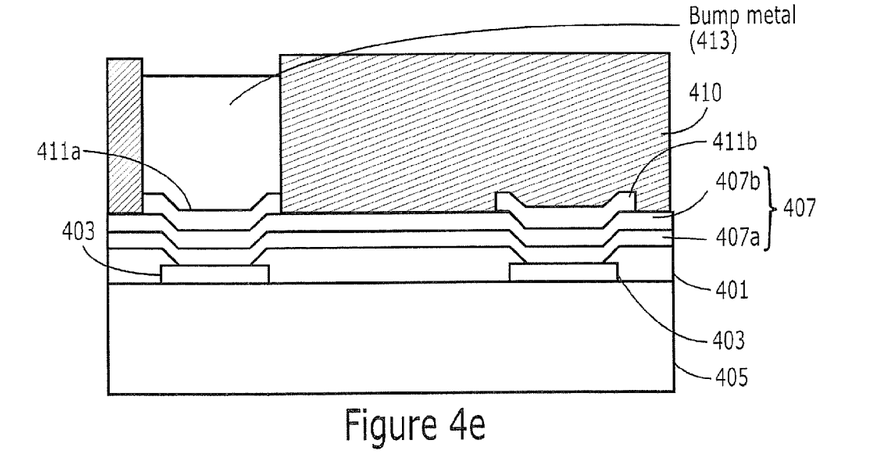

The first mask 409 may be removed, and a second mask 410 may be formed so that at least one barrier layer 411a is exposed and so that at least one barrier layer 411b is covered, as shown in FIG. 4e. A bump metal 413 may be formed on the exposed barrier metal 411a, while the covered barrier metal 411b is maintained free of bump metal. The bump metal 413, for example, may include a metal such as antimony, silver, bismuth, tin, lead, copper, gold, nickel, zinc, and/or alloys thereof According to particular embodiments of the present invention, the bump metal 413 may include a lead/tin solder. Moreover, the bump metal may be formed by electroplating, electrolytic plating, and/or catalytic plating. In another alternative, the bump metal 413 may be formed by filling the mask aperture(s) with a solder paste and melting (and cooling) the solder paste to fuse the paste into a solid bump. In still other embodiments, the bump metal 413 may be formed by liquid metal jetting and/or screen printing.

Figure 4F:
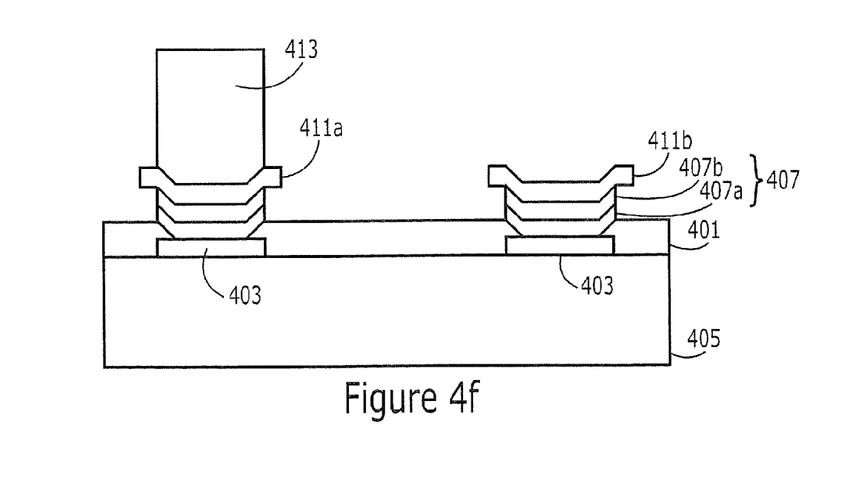

The mask 410 may be removed thereby exposing portions of the seed layer 407, and exposed portions of the seed layer 407 may be removed using the barrier layers 411a-b as etching masks, as shown in FIG. 4f. In particular, a wet etch chemistry may be selected that etches the seed layer 407 selectively with respect to the barrier layers 411a-b. Accordingly, undercutting of the seed layer 407 may occur between the barrier layers 411a-b and the passivation layer 401. Moreover, the wet etch chemistry may be such that the bump metal is also etched selectively with respect to the barrier layer 411a. Accordingly, surface portions of the barrier layer 411a may be exposed by the bump metal 413 adjacent edges thereof. More particularly, the bump metal 413 may be sufficiently thicker than the seed layer 407 so that exposed portions of the seed layer 407 may be removed without removing enough of the bump metal 413 to significantly effect the performance thereof. The bump metal 413 can then be reshaped by melting (i.e. reflow).

While not shown in FIGS. 4a-f for the sake of clarity, sidewalls of the mask 409, the barrier layer 411, and the bump metal 413 may be sloped at an angle θ as discussed above with respect to FIGS. 1 and 2. Moreover, the bump metal 413 can be used to provide electrical and/or mechanical interconnection with a next level of packaging such as another substrate and/or a printed circuit board. According to particular embodiments of the present invention, the adhesion layer 407a may include a layer of titanium and/or titanium-tungsten; the conductivity layer 407b may include a layer of copper; the barrier metal 411a-b may include layers of nickel-vanadium; oxidation barriers on the barrier metal 411a-b may include a layer of gold; and the bump metal 413 may include lead-tin solder. Moreover, one or more of the above referenced layers may have a multi-layer structure.

As discussed above with respect to FIGS. 4a-f, a bump metal 413 may be selectively plated on a first barrier metal 411a, while a second barrier metal 411b is maintained free of bump metal. Accordingly, bump metal 413 may be used to provide a solder connection to another substrate (such as a printed circuit board or another semiconductor substrate), while the barrier layer 411b (which is maintained free of bump metal) may be used to provide different interconnects such as wire bond interconnects.

According to additional embodiments of the present invention, all of barrier layers 411 may be maintained free of bump metal until after removing exposed portions of the seed layer 407 using the barrier layers 411 as etch masks. By way of example, solid solder preforms (such as preformed solder balls) may be placed on some or all of the barrier layers 411 after removing exposed portions of the seed layer 407 using the barrier layers 411 as etch masks. The solid solder preform (s) can be bonded to the respective barrier layer (s) 411, for example, by pressure, heating, and/or melting. In an alternative, bump metal may be provided on another substrate to which the substrate 405 is to be bonded, and the barrier layers 411 may be bonded to the bump metal provided on the other substrate.

According to still additional embodiments of the present invention, bump metal 413 may be selectively formed on barrier layer 411a without providing a second mask 410. More particularly, the mask 409 exposing both barrier layers 411a-b may be maintained, and bump metal 413 may be selectively formed on barrier layer 411a, for example, using selective metal jetting and/or selective screen printing into the hole exposing the barrier layer 411a without jetting or screen printing into the hole exposing the barrier layer 411b. Accordingly, the structure of FIG. 4f may be provided without requiring the second mask 410. Where one or both of the barrier layers 411a-b are exposed to the atmosphere before providing bump metal thereon, oxidation barriers may be provided on the barrier layers 411a-b as discussed above. The oxidation barriers, for example, may include layers of at least one of copper, tin, platinum, palladium, silver, and/or gold, and the oxidation barriers can be plated through the mask 409 after plating the barrier layers 411a-b. The oxidation barriers, for example, may include layers of gold. Separate oxidation layers, however, may not be required in the barrier layers 411a-b include a metal such as gold, silver, platinum, and/or palladium that is resistant to oxidation.

Figure 5A:
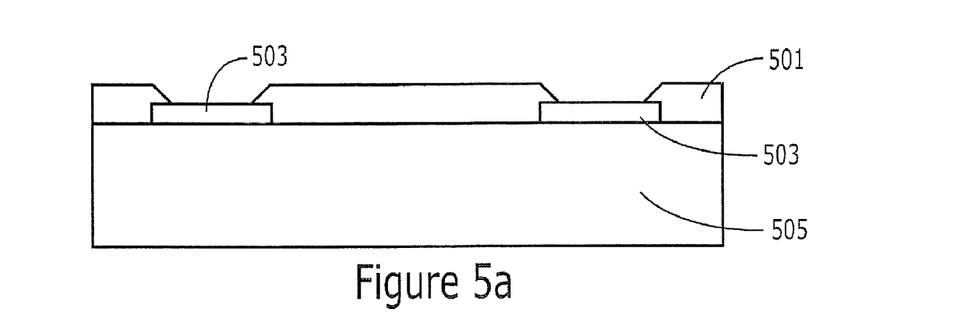
FIGS. 5a-5h are cross-sectional views illustrating steps of forming electronic structures according to still more embodiments of the present invention.

FIGS. 5a-h are cross-sectional views illustrating steps of forming metallurgy structures according to additional embodiments of the present invention. As shown in FIG. 5a, metal pads 503 (such as aluminum pads) and a passivation layer 501 (such as a silicon oxide layer, a silicon nitride layer, a polyimide layer, and/or other insulating layers) may be provided on a substrate 505 (such as a semiconductor wafer including electronic devices therein). As shown, via holes in the passivation layer 501 may expose portions of the metal pads 503.

Figure 5B:
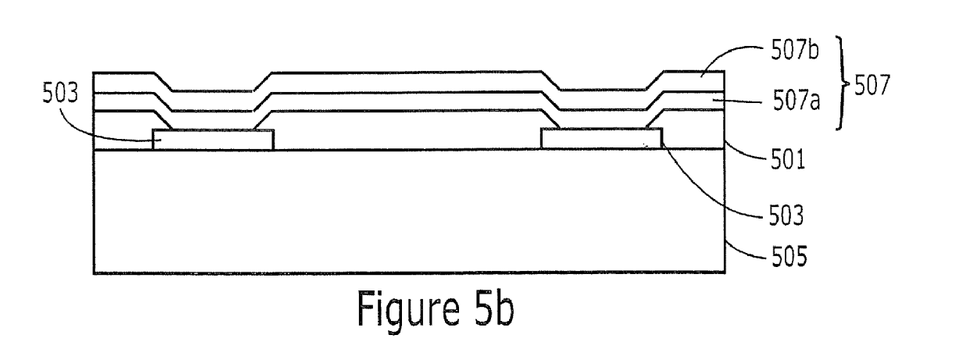

As shown in FIG. 5b, a seed layer 507 may be formed on the passivation layer 501 and on exposed portions of the metal pads 503. By way of example, the seed layer 507 may include an adhesion layer 507a and a conductivity layer 507b. The adhesion layer 507a may include a layer of a metal such as titanium, tantalum, tungsten, chromium, aluminum, copper, iridium, and/or platinum, and/or alloys thereof and/or nitrides thereof. According to particular embodiments, the adhesion layer 507a may include a layer of titanium and/or titanium-tungsten. The conductivity layer 507b may include a layer of a metal such as aluminum, copper, nickel, gold, silver, and/or alloys thereof. According to particular embodiments, the conductivity layer 507b may include a layer of copper. The seed layer 507 may also include one or more additional layers, such as a layer to reduce interdiffusion between the adhesion layer 507a and the conductivity layer 507b. An interdiffusion layer, for example, may include a layer of a metal such as titanium, tantalum, tungsten, chromium, nickel, iridium, platinum, and/or alloys thereof and/or nitrides thereof. According to particular embodiments, an interdiffusion layer may include a phased layer of chromium and copper between the adhesion layer 507a and the conductivity layer 507b.

Figure 5C:
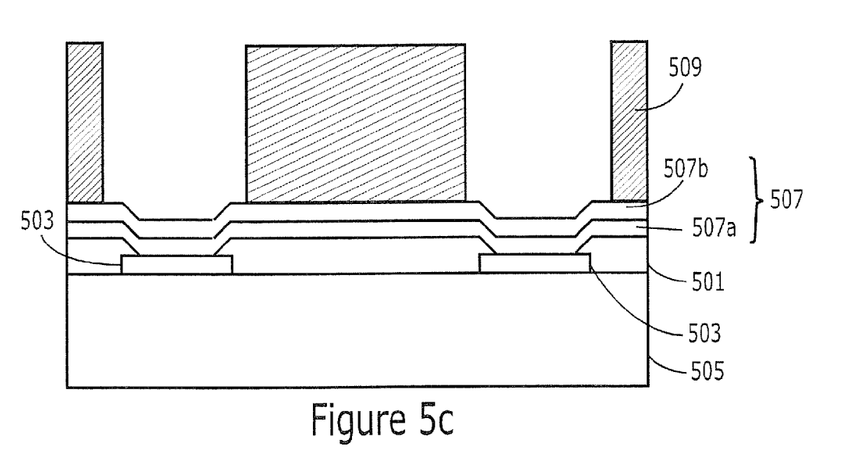

As shown in FIG. 5c, a mask 509 may be formed on the seed layer 507 thereby exposing portions of the seed layer 507 where bump metal is to be formed. The mask 509, for example, may be a photoimageable polymeric material, a metallic material having apertures therein, and/or a flexible polymeric material having apertures therein. According to particular embodiments, the seed layer 507 may be used as an electroplating electrode to electroplate a barrier metal on portions thereof exposed by the mask 509.

Figure 5D:
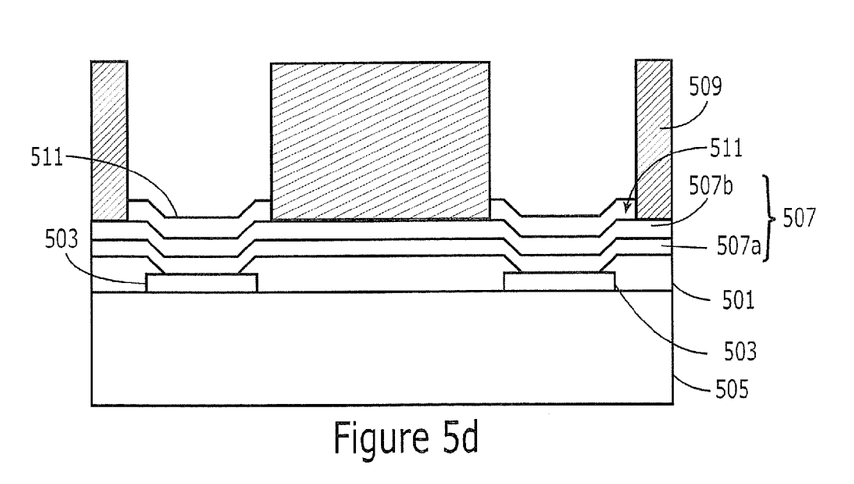

As shown in FIG. 5d, a barrier metal 511 may be formed on portions of the seed layer 507 exposed by the mask 509. Moreover, the barrier metal 511 may include a layer of a material different than material(s) used for the seed layer 507 and different than material(s) used for a subsequently provided bump metal. The barrier metal 511, for example, may include a metal such as nickel, cobalt, platinum, silver, palladium, gold, and/or alloys thereof According to particular embodiments of the present invention, the barrier metal 511 may include a nickel layer, and the nickel layer may be doped with boron and/or phosphorus. In addition or in an alternative, the nickel layer may include a layer of nickel-vanadium. Moreover, the barrier layer may be formed by electroplating, catalytic plating, and/or electrolytic plating. In addition, an oxidation barrier may be plated through the mask 509 on the barrier metal 511, and the oxidation barrier may include at least one of copper, tin, platinum, palladium, silver, and/or gold. More particularly, the oxidation barrier may include a layer of gold. According to particular embodiments, the barrier metal 511 may include a layer of nickel-vanadium, and the oxidation layer may include a layer of gold. Accordingly, oxidation of an exposed surface can be reduced prior to provide bump metal thereon. Moreover, an oxidation barrier may be considered a part of the barrier metal. A separate oxidation barrier may not be required if the barrier metal 511 includes a metal such as platinum, palladium, silver, and/or gold that is resistant to oxidation.

Figure 5E:
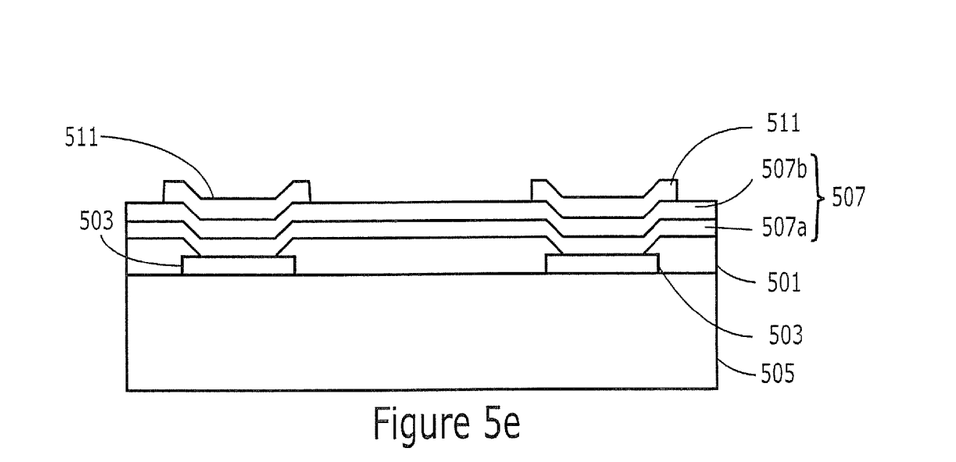
Figure 5F:
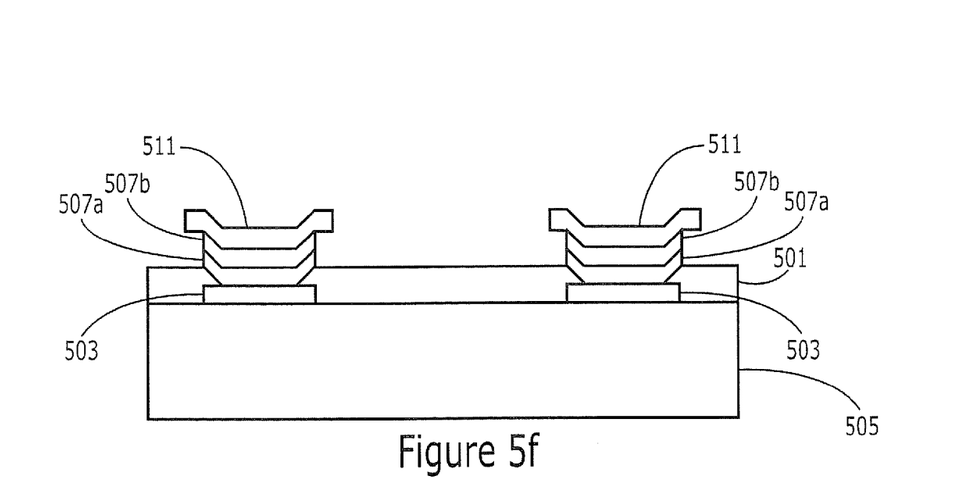

The mask 509 may then be removed as shown in FIG. 5e thereby exposing portions of the seed layer 507, and exposed portions of the seed layer 507 may be removed using the barrier layers 511 as etching masks, as shown in FIG. 5f. In particular, a wet etch chemistry may be selected that etches the seed layer 507 selectively with respect to the barrier layers 511. Accordingly, undercutting of the seed layer 507 may occur between the barrier layers 511 and the passivation layer 501. Bump metal may be provided on the barrier layers 511 (and/or oxidation barriers) before or after removing exposed portions of the seed layer. According to particular embodiments of the present invention, the adhesion layer 507a may include a layer of titanium and/or titanium-tungsten; the conductivity layer 507b may include a layer of copper; the barrier metal 511 may include a layer of nickel-vanadium; an oxidation barrier on the barrier metal 511 may include a layer of gold; and bump metal 513, 513' may include lead-tin solder. Moreover, one or more of the above referenced layers may have a multi-layer structure.

Figure 5G:
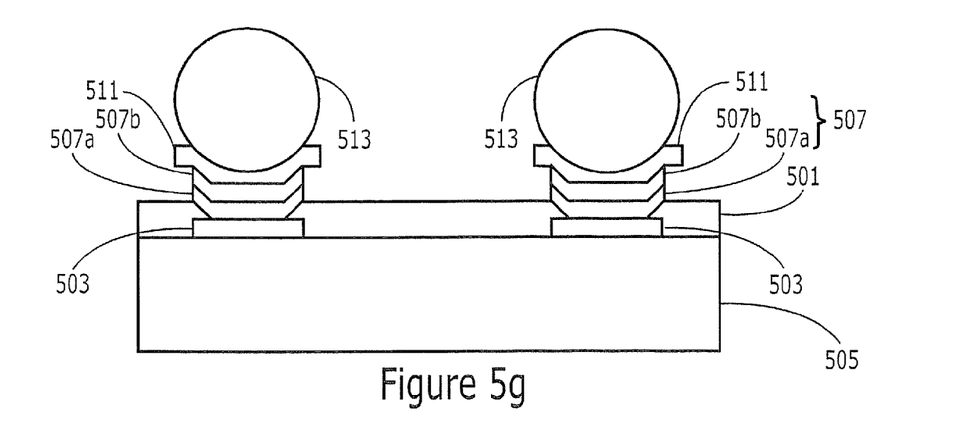

In some embodiments of the present invention illustrated in FIG. 5g, all of the barrier layers 511 (and/or oxidation barriers) may thus be maintained free of bump metal until after removing exposed portions of the seed layer 507 using the barrier layers 511 (and/or oxidation barriers) as etch masks. By way of example, solid solder preforms 513 (such as preformed solder balls) may be placed on some or all of the barrier layers 511 (and/or oxidation barriers) after removing exposed portions of the seed layer 507 using the barrier layers 511 (and/or oxidation barriers) as etch masks as shown in FIG. 5g. The solid solder preforms 513 can be bonded to the respective barrier layers 511 (and/or oxidation barriers), for example, by pressure, heating, and/or melting. In other alternatives, bump metal may be selectively provided on barrier layers 511 (and/or oxidation barriers), for example, using selective metal jetting and/or selective screen printing. The bump metal 513, for example, may include a metal such as antimony, silver, bismuth, tin, lead, copper, gold, nickel, zinc, and/or alloys thereof. According to particular embodiments of the present invention, the bump metal 513 may include a lead/tin solder. Moreover, the solid solder performs 513 or other bump metal can be used to provide electrical and/or mechanical interconnection with a next level of packaging such as another substrate and/or a printed circuit board. As discussed above, the barrier layers 511 may be defined to include oxidation barrier layers if separate oxidation barrier layers are provided thereon.

Figure 5H:
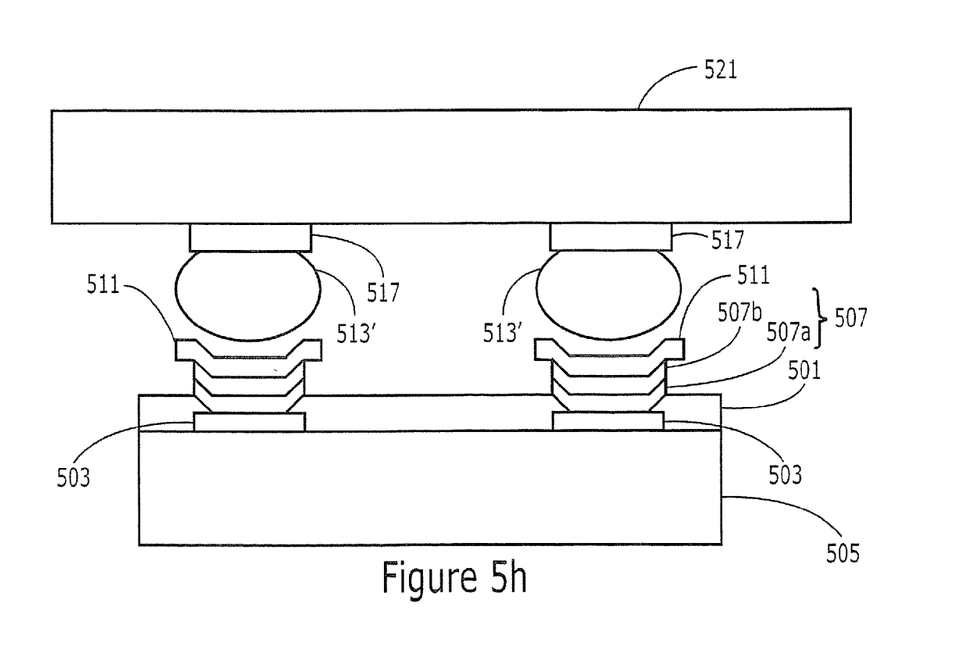

In other embodiments of the present invention illustrated in FIG. 5h, all of the barrier layers 511 (and/or oxidation barriers) may thus be maintained free of bump metal until after removing exposed portions of the seed layer 507 using the barrier layers 511 (and/or oxidation barriers) as etch masks. By way of example, bump metal 513' may be provided on another substrate 521 to which the substrate 505 is to be bonded, and the barrier layers 511 (and/or oxidation barriers) may be bonded to the bump metal 513' provided on the other substrate. The bump metal 513' on the other substrate 521 can be bonded to respective barrier layers 511 (and/or oxidation barriers), for example, by pressure, heating, and/or melting. The bump metal 513', for example, may include a metal such as antimony, silver, bismuth, tin, lead, copper, gold, nickel, zinc, and/or alloys thereof. According to particular embodiments of the present invention, the bump metal 513' may include a lead/tin solder. By way of example, the bump metal 513' may be provided on respective pads 517 of the substrate 521 by plating, jetting, screen printing, and/or placement of preformed solder balls prior to mating with barrier layers 511 (and/or oxidation barriers) of substrate 505. Moreover, the pads 517 of the substrate 521 may include adhesion layers, conduction layers, and/or barrier layers as discussed above with respect to layers 507a, 507b, and/or 511 of the substrate 505.

While the present invention has been particularly shown and described with reference to embodiments thereof, it will be understood by those skilled in the art that various changes in form and details may be made therein without departing from the spirit and scope of the invention as defined by the appended claims and their equivalents.

That which is claimed is:

1. A method of forming an electronic structure, the method comprising:
   forming a seed layer on a substrate;
   forming a mask on the seed layer, the mask including an aperture therein exposing a portion of the seed layer;
   forming a barrier layer on the exposed portion of the seed layer;
   forming a bump metal on the barrier layer;
   removing the mask; and
   selectively removing portions of the seed layer using the barrier layer as an etch mask;
   wherein forming the bump metal is subsequent to selectively removing portions of the seed layer using the barrier layer as an etch mask.

2. A method according to claim 1 wherein forming the bump metal comprises placing a solid solder preform on the barrier layer.

3. A method according to claim 1 further comprising:
   before forming the bump metal on the barrier layer, forming an oxidation barrier on the barrier layer wherein the oxidation barrier and the barrier layer comprise different materials.

4. A method according to claim 1 wherein selectively removing portions of the seed layer comprises etching portions of the seed layer exposed by the barrier layer using an etch chemistry that etches the seed layer selectively with respect to the barrier layer.

5. A method according to claim 1 wherein the barrier layer comprises a material different than the seed layer and different than the bump metal.

6. A method according to claim 5 wherein the seed layer comprises an adhesion layer on the substrate and a conductivity layer on the adhesion layer so that the adhesion layer is between the conductivity layer and the substrate.

7. A method according to claim 6 wherein the adhesion layer comprises at least one of titanium, tantalum, tungsten, chromium, aluminum, copper, iridium, platinum, and/or alloys thereof, and/or nitrides thereof.

8. A method according to claim 6 wherein the conductivity layer comprises at least one of aluminum, copper, nickel, gold, silver, and/or alloys thereof.

9. A method according to claim 5 wherein the barrier layer comprises at least one of nickel, cobalt, platinum, silver, palladium, gold, and/or alloys thereof.

10. A method according to claim 9 wherein the barrier layer comprises a layer of nickel-vanadium.

11. A method according to claim 5 wherein the bump metal comprises at least one of antimony, silver, bismuth, tin, lead, copper, silver, gold, nickel, zinc, and/or alloys thereof.

12. A method of forming an electronic structure, the method comprising:
    forming a seed layer on a substrate;
    selectively forming a barrier layer on a portion of the seed layer wherein the barrier layer and the seed layer comprise different materials and wherein the barrier layer comprises at least one of nickel, cobalt, platinum, silver, palladium, gold, and/or alloys thereof
    selectively removing portions of the seed layer using the barrier layer as an etching mask; and
    after selectively removing portions of the seed layer, providing a bump metal on the barrier layer opposite the seed layer wherein the bump metal and the barrier layer comprise different materials.

13. A method according to claim 12 wherein providing the bump metal comprises placing a solid solder preform on the barrier layer after selectively removing portions of the seed layer.

14. A method according to claim 13 further comprising:
    before providing the bump metal, forming an oxidation barrier on the barrier layer wherein the oxidation barrier comprises a material different than a material of the barrier layer.

15. A method according to claim 12 wherein selectively removing portions of the seed layer comprises etching portions of the seed layer exposed by the barrier layer using an etch chemistry that etches the seed layer selectively with respect to the barrier layer.

* * * * *